(12) United States Patent
Koch (10) Patent No.: US 10,206,316 B1
(45) Date of Patent: Feb. 12, 2019

(54) DIE CAST ENCLOSURE WITH EMC SHIELDING TEETH

(71) Applicant: VISTEON GLOBAL TECHNOLOGIES, INC., Van Buren Township, MI (US)

(72) Inventor: Marcus Walter Koch, Karlsruhe (DE)

(73) Assignee: VISTEON GLOBAL TECHNOLOGIES, INC., Van Buren Township, MI (US)

( * ) Notice: Subject to any disclaimer, the term of this patent is extended or adjusted under 35 U.S.C. 154(b) by 0 days.

(21) Appl. No.: 15/873,962

(22) Filed: Jan. 18, 2018

(51) Int. Cl.
| | |
|---|---|
| H05K 9/00 | (2006.01) |
| H05K 5/04 | (2006.01) |
| B22D 17/00 | (2006.01) |
| H05K 7/14 | (2006.01) |
| H05K 5/00 | (2006.01) |

(52) U.S. Cl.
CPC ......... *H05K 9/0009* (2013.01); *B22D 17/007* (2013.01); *H05K 5/0008* (2013.01); *H05K 5/04* (2013.01); *H05K 7/1427* (2013.01); *H05K 9/0049* (2013.01)

(58) Field of Classification Search
CPC ............................. H05K 7/1427; H05K 9/0009
See application file for complete search history.

(56) References Cited

U.S. PATENT DOCUMENTS

| | | | | | |
|---|---|---|---|---|---|
| 5,170,009 | A * | 12/1992 | Kadokura | ............. | C09D 5/448 174/363 |
| 6,313,400 | B1 * | 11/2001 | Mosquera | ............. | H05K 5/026 174/363 |
| 6,992,901 | B1 * | 1/2006 | Hung | ............. | H05K 9/0009 174/385 |
| 7,687,725 | B2 * | 3/2010 | Hogan | ............. | H05K 9/0009 174/367 |
| 8,016,372 | B2 * | 9/2011 | Yeh | ............. | H05K 9/0009 312/223.2 |
| 8,039,763 | B1 * | 10/2011 | Cochrane | ............. | H05K 9/0009 174/377 |
| 8,253,037 | B2 * | 8/2012 | Teo | ............. | H05K 9/0009 174/363 |
| 8,563,874 | B2 * | 10/2013 | Quek | ............. | H05K 9/0009 174/373 |
| 2010/0126766 | A1 * | 5/2010 | Lynam | ............. | H05K 9/0009 174/377 |

* cited by examiner

*Primary Examiner* — Hung V Ngo
(74) *Attorney, Agent, or Firm* — Dickinson Wright PLLC (57) ABSTRACT

An enclosure for holding a printed circuit board includes a housing portion of metal containing at least about 90% magnesium and formed by a semi-solid metal casting process of thixomolding, and including first and second housing portions each including a closed end and an open end with a plurality of teeth where the first and second portions join together in a clamshell arrangement to define an enclosed space for holding the printed circuit board. The teeth of the first housing portion may be aligned to overlap and to engage corresponding ones of the teeth of the second housing portion in physical and electrical contact for blocking electromagnetic interference (EMI) with the housing portions closed together. A method of forming a housing portion of an enclosure for holding a printed circuit board is also provided, and which includes steps of thixomolding magnesium to form the housing portion with integrally-formed teeth.

17 Claims, 8 Drawing Sheets

DIE CAST ENCLOSURE WITH EMC SHIELDING TEETH

BACKGROUND

Many different types of metal enclosures exist for holding a printed circuit board (PCB) and which provide electromagnetic compatibility (EMC) by including shielding and/or by restricting the size of any holes or gaps in the enclosure to control the ability of electromagnetic radiation waves to pass through the enclosure.

Various methods of making enclosures of metal exist today. Each method has advantages and drawbacks. Enclosures formed of sheet metal are able to be formed inexpensively and are able to be provided with integral EMC shielding, such as, for example, by including electrically conductive contacts formed by stamping and/or bending portions of a flat wall. However, enclosures of sheet metal include several design limitations inherent in the process of bending and forming a thin metal sheet. Sheet metal enclosures are also generally less effective at dissipating heat than enclosures of cast metal, making them unsuitable for many applications requiring relatively high amounts of energy to be dissipated in the form of heat and without exceeding temperature thresholds. Enclosures of cast metal have historically had their own set of drawbacks including relatively wide tolerances and brittle materials. The wide tolerances and the brittle nature of traditional cast metal enclosures prevented the enclosures from being integrally formed with resiliently deflectable contacting teeth to make electrical contact between housing portions of the enclosure. Therefore, large numbers of screws or other fasteners were commonly used with such cast enclosures to minimize gaps between enclosure portions and to provide EMC shielding.

Therefore, there exists a need for an inexpensive enclosure for holding a printed circuit board that minimizes gaps between enclosure portions to prevent electromagnetic waves from propagating therethrough.

SUMMARY

An enclosure for holding a printed circuit board includes a first housing portion of metal containing magnesium and extending between a closed end and an open end defining a rim thereabout. The enclosure may also include a second housing portion engaging the open end of the first housing portion to define an enclosed space within the housing portions for holding the printed circuit board. A plurality of first teeth may be integrally formed with the first housing portion about the open end and extending beyond the rim opposite the closed end. The first teeth may each engage the second housing portion in physical and electrical contact for blocking electromagnetic radiation from passing through the enclosure (either inwardly or outwardly) with the housing portions closed together. Furthermore, the first teeth may be elastically deformable to deflect from the second housing portion for providing a biasing force therebetween when the housing portions are closed together.

A method of forming a housing portion of an enclosure for holding a printed circuit board is also provided which comprises the steps of: providing chips containing magnesium into a heated barrel; and heating the chips to a temperature between a solidus temperature and a liquidus temperature to create a semi-solid slurry. The method continues with the step of substantially filling the first mold cavity before the slurry solidifies to form the semi-solid slurry into a rough casting defining the shape of a housing portion extending between a closed end and an open end defining a rim thereabout and with a plurality of teeth disposed about and extending beyond the rim.

Enclosures including integrally-formed and elastically deformable teeth of the present invention may provide several advantages over EMC shielding means in common use today. They may provide both cost reductions and improved reliability over time.

BRIEF DESCRIPTION OF THE DRAWINGS

The detailed description refers to the following drawings, in which like numerals refer to like items, and in which.

DETAILED DESCRIPTION

The invention is described more fully hereinafter with references to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. It will be understood that for the purposes of this disclosure, "at least one of each" will be interpreted to mean any combination the enumerated elements following the respective language, including combination of multiples of the enumerated elements. For example, "at least one of X, Y, and Z" will be construed to mean X only, Y only, Z only, or any combination of two or more items X, Y, and Z (e.g., XYZ, XZ, YZ, X). Throughout the drawings and the detailed description, unless otherwise described, the same drawing reference numerals are understood to refer to the same elements, features, and structures. The relative size and depiction of these elements may be exaggerated for clarity, illustration, and convenience. Unless otherwise stated, any reference to moving between two or more different positions should be construed as including moving in either direction from one position to another position or vice-versa.

Figure 1:
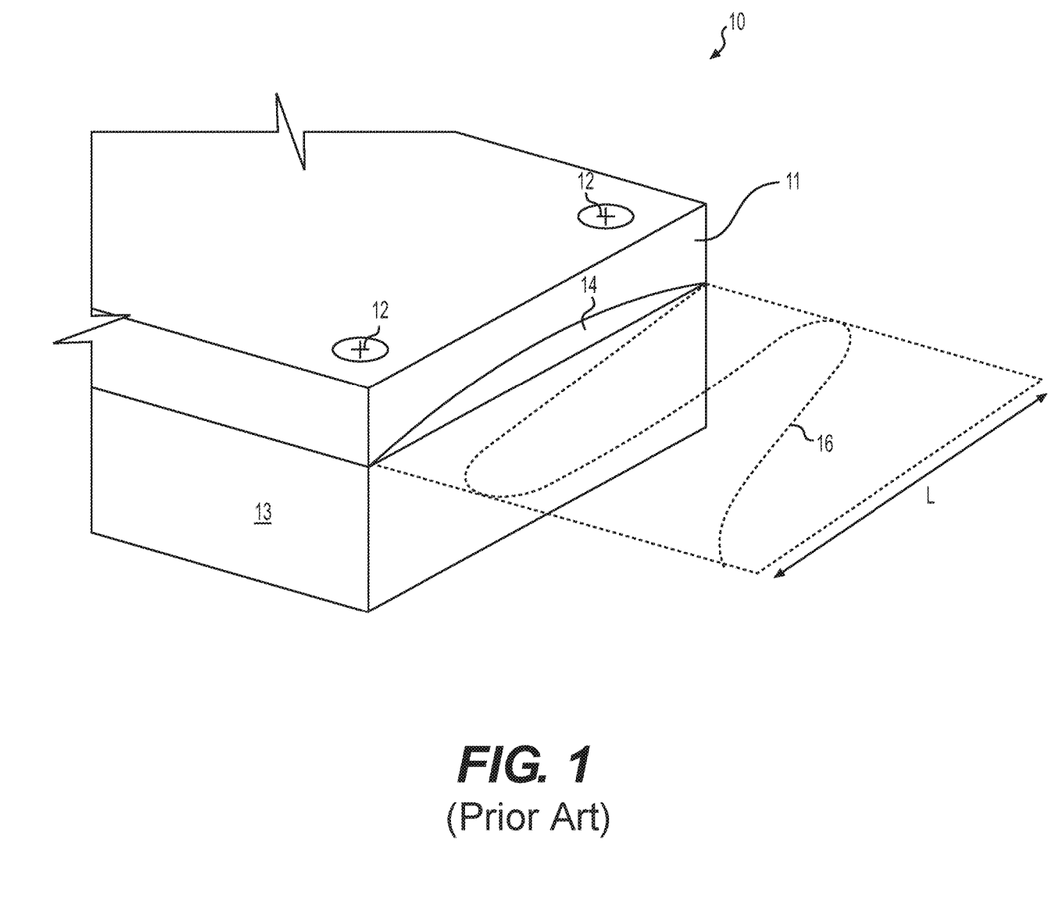
FIG. 1 is a partial perspective view of an enclosure of the prior art.
Figure 2:
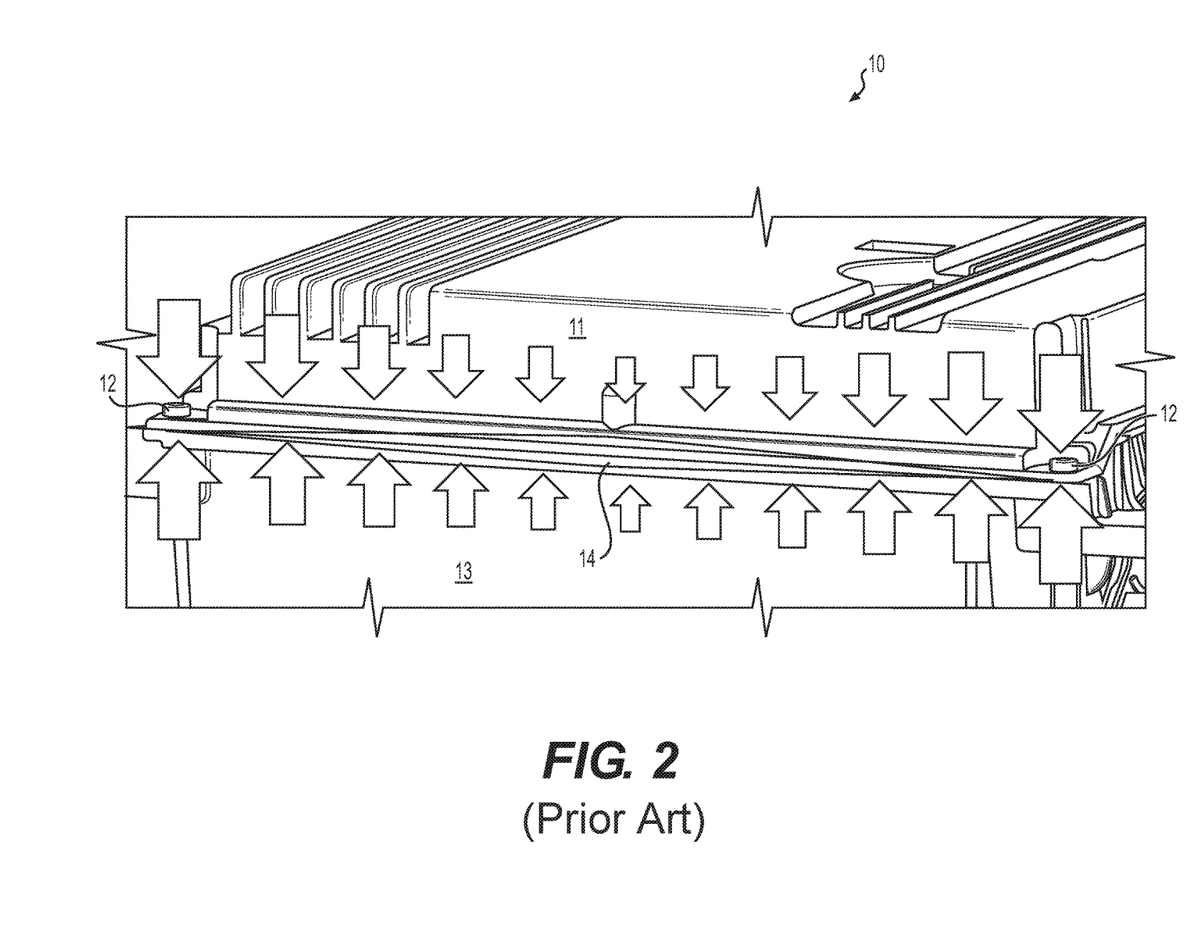
FIG. 2 is a side view of an enclosure of the prior art showing non-uniform compressive force arrows.
Figure 3:
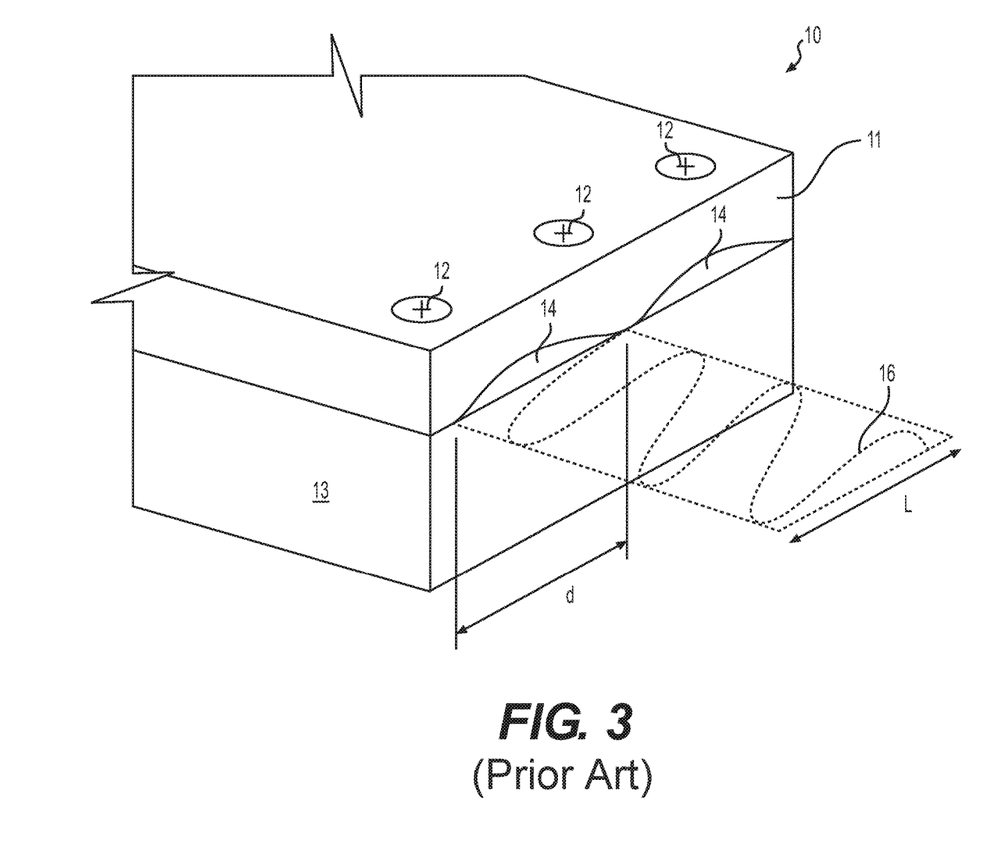
FIG. 3 is a partial perspective view of another enclosure of the prior art.

Designs for enclosures 10 according to the prior art are shown in FIGS. 1-4. One such design, shown in FIG. 1, includes an upper portion 11 attached with screws 12 to a lower portion 13. As illustrated in FIGS. 1-3, such arrangements can cause one or more gaps 14 to open between the upper and lower portions 11, 13, which can allow electromagnetic waves 16 to propagate through the enclosure 10, with energy being transferred into or out of the enclosure 20. Such unwanted electromagnetic waves 16 may adversely impact the functionality of circuitry contained within the enclosure 10, and/or may cause unwanted interference in other nearby devices. As illustrated in FIG. 1, the wavelength L of the electromagnetic waves 16 that may propagate through gaps 14 in the enclosure 10 may be up to approximately the distance d of the gap 14. The reduction of unwanted electromagnetic waves 16 is referred to as electromagnetic compatibility (EMC).

As shown in FIG. 2, torque applied to the screws 12 between the upper and lower portions 11, 13 may cause uneven pressure between those portions 11, 13 which may cause elastic and/or plastic deformation, which can result in gaps 14 being formed therebetween. FIG. 3 illustrates a method of EMC in practice today, which involves adding screws 12 to reduce the distance d therebetween and to thereby reduce the size of gaps 14, which has the effect of reducing the wavelength L of electromagnetic waves 16 that can propagate through the enclosure 10. In other words, electromagnetic radiation having wavelengths L greater than about the distance d of the gaps 14 are effectively blocked from passing through the enclosure 10. However, adding screws 12 has several disadvantages in cost, complexity, and time required for assembly and disassembly.

Figure 4:
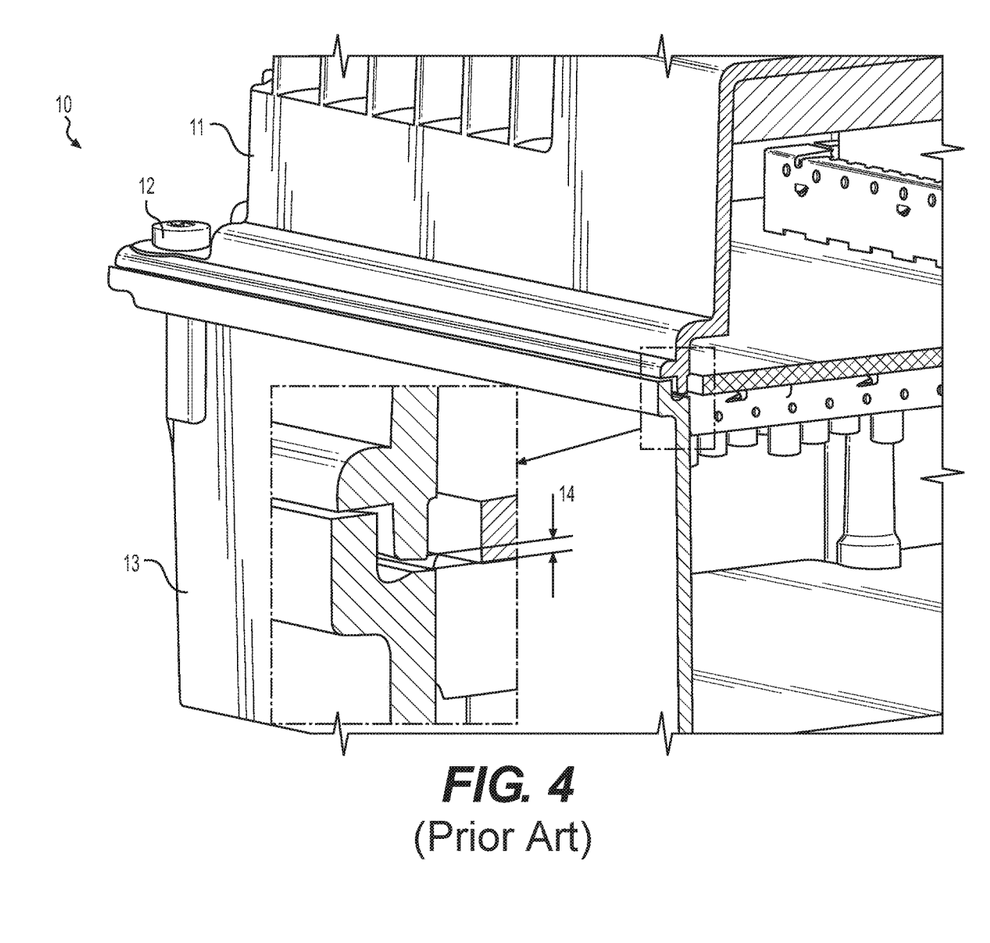
FIG. 4 is a perspective cut-away view of a section of an enclosure of the prior art.

FIG. 4 shows another enclosure 10 of the prior art which includes interlocking rims between the upper and lower portions 11, 13. However, such prior art enclosures 10 with interlocking rims require gaps 14 between the upper and lower portions 11, 13. Such gaps 14 may vary in size due to manufacturing tolerances as well as deformation from uneven pressure between those portions 11, 13.

Figure 5:
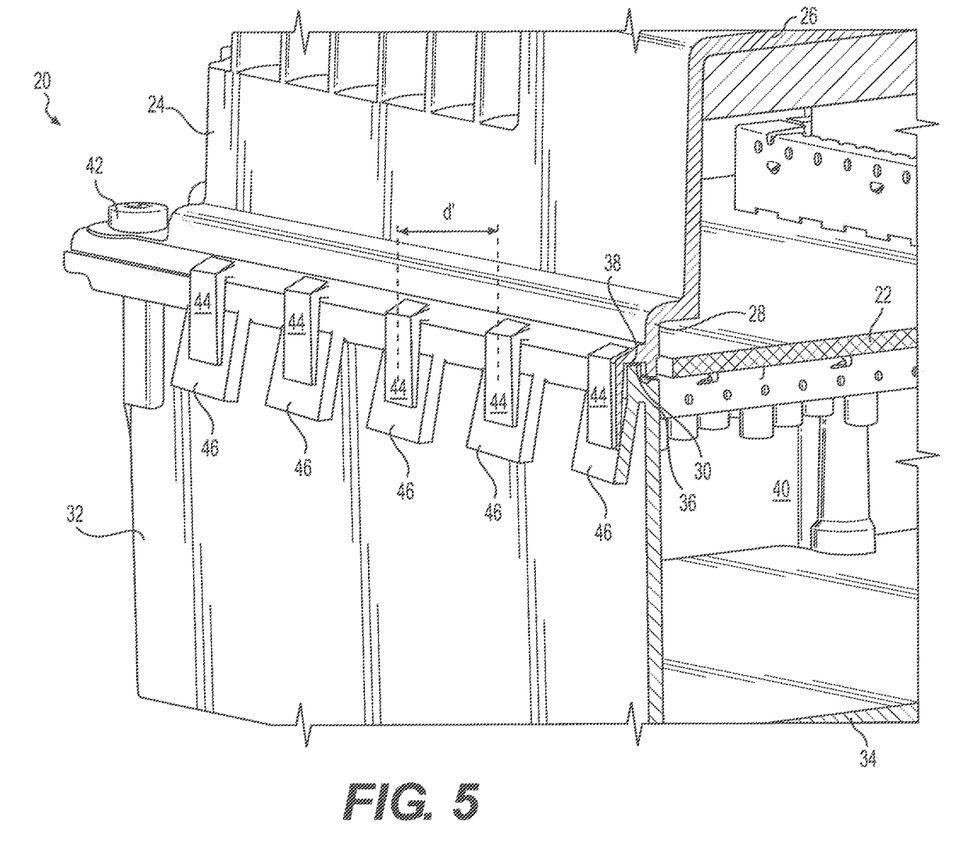
FIG. 5 is a perspective cut-away view of an enclosure according to an aspect of the present disclosure.

Referring to the Figures, wherein like numerals indicate corresponding parts throughout the several views, an enclosure 20 for holding a printed circuit board 22 is disclosed in FIGS. 5-10. As shown in FIG. 5, the enclosure 20 may comprise a first housing portion 24, which may have a generally rectangular shape extending between a closed upper end 26 and an open lower end 28 with a lower rim 30 extending thereabout. The enclosure 20 may also comprise a second housing portion 32 which may have a generally rectangular shape extending between a closed lower end 34 and an open upper end 36 with an upper rim 38 extending thereabout for mating with the lower rim 30 of the first housing portion 24. In other words, and as shown in the FIGS. 5-10, the housing portions 24, 32 may be configured to be closed together with the open lower rim 30 of the first housing portion 24 engaging the upper rim 38 of the second housing portion 32 in a clamshell arrangement to define an enclosed space 40 within the housing portions 24, 32 for holding the printed circuit board 22. One or both of the housing portions 24, 32 may have other shapes such as, for example, hemispherical, bulbous, flat planar, irregular, or may include a combination of different shapes. One or both of the housing portions 24, 32 may also include other structures such as, for example, mounting tabs, cooling fins, etc. A plurality of one or more fasteners 42 may be used for holding the housing portions 24, 32 together. The fasteners 42 may be screws 12, however, other types of fasteners 42 may be used including, for example, clips, clamps, rivets, etc.

According to an aspect, the first and second housing portions 24, 32 may each be made of metal containing magnesium may be formed by die casting. More specifically, the housing portions 24, 32 may be formed by a semi-solid metal casting process. Most specifically, the housing portions 24, 32 may be formed by thixomolding. According to an aspect, the metal containing magnesium may include at least about 90% magnesium.

As shown in FIG. 5, the enclosure 20 may include a plurality of first teeth 44 disposed about the open lower end 28 and extending beyond the lower rim 30 opposite the closed upper end 26. According to an aspect, the first teeth 44 may be integrally formed with the first housing portion 24. The enclosure 20 may also include plurality of second teeth 46 disposed about the open upper end 36 and extending downwardly toward the closed lower end 34. According to an aspect, and as shown in FIG. 5, the second teeth 46 may also be angled outwardly away from the enclosed space 40. According to an aspect, the second teeth 46 may be integrally formed with the second housing portion 32. In practice, with the enclosure 20 closed, the first teeth 44 may be aligned to overlap and to engage corresponding ones of the second teeth 46 in physical and electrical contact for blocking electromagnetic interference (EMI) with the housing portions 24, 32 closed together. Furthermore, at least one of the first teeth 44 and the second teeth 46 may be elastically deformable to deflect from the other corresponding ones of the teeth 44, 46 for providing a biasing force therebetween with the housing portions 24, 32 closed together. In other words, the thickness, geometry, and the material characteristics of the first teeth 44, the second teeth 46, or all of the teeth 44, 46, may be selected to cause one or both of the teeth 44, 46 in a corresponding set to be elastically deformed as a result of the contact therebetween as the enclosure 20 is closed to secure the corresponding teeth 44, 46 in physical and electrical contact with one another. The teeth 44, 46 may be spaced apart by a predetermined distance d' to meet electromagnetic compatibility (EMC) design requirements.

According to an aspect, and as shown in FIG. 5, at least one of the first teeth 44 may taper from a first thickness adjacent the open lower end 28 to a second thickness less than the first thickness spaced apart from the open lower end 28. As a result, such tapered ones of the first teeth 44 may deflect outwardly away from the enclosed space 40 as the first teeth 44 engage the second teeth 46 to provide a contact pressure therebetween. Also, one or more of the second teeth 46 which are aligned with the tapered ones of the first teeth 44 may have a uniform thickness to provide structural rigidity in opposition to the contact pressure exerted by the contact with the corresponding tapered ones of the first teeth 44.

Figure 6:
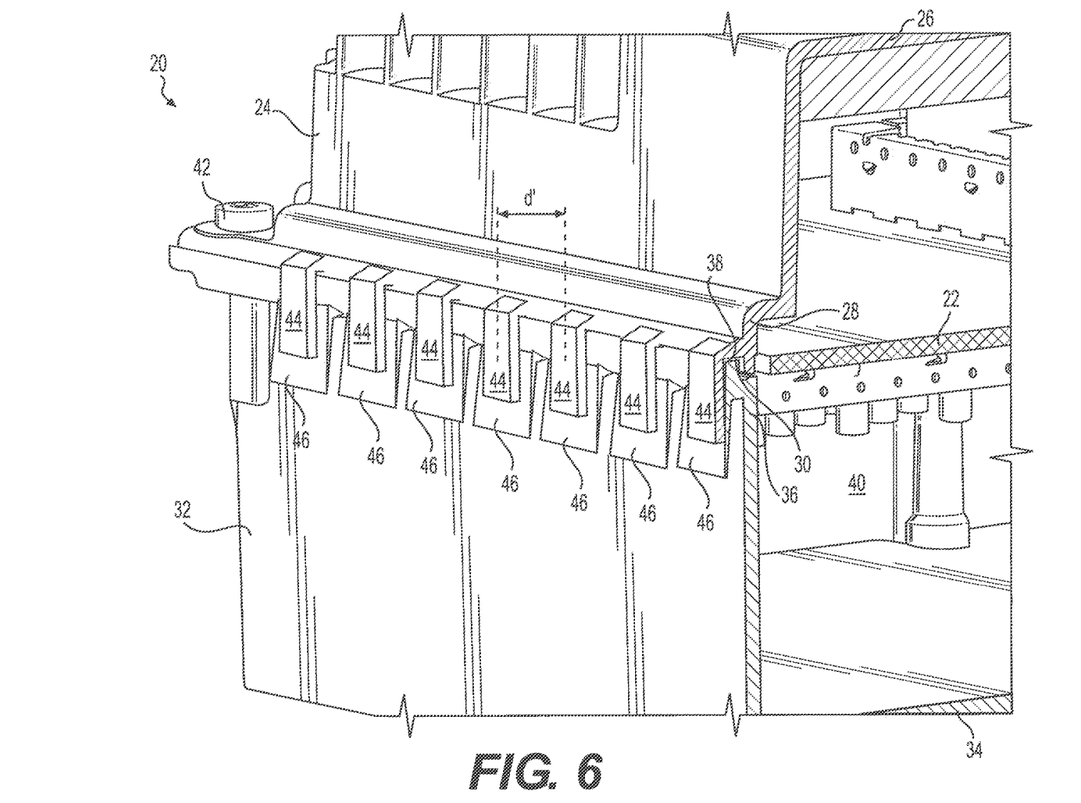
FIG. 6 is a perspective cut-away view of an enclosure according to an aspect of the present disclosure.

According to an alternative aspect as shown in FIG. 6, at least one of the second teeth 46 may taper from a first thickness adjacent the open upper end 36 to a second thickness less than the first thickness spaced apart from the open upper end 36. As a result, the tapered ones of the second teeth 46 may deflect inwardly toward the enclosed space 40 as the first teeth 44 engage the second teeth 46 to provide a contact pressure therebetween. Also, one or more of the first teeth 44 which are aligned with the tapered ones of the second teeth 46 may have a uniform thickness to provide structural rigidity in opposition to the contact pressure exerted by the contact with the corresponding tapered ones of the second teeth 46.

Figure 7:
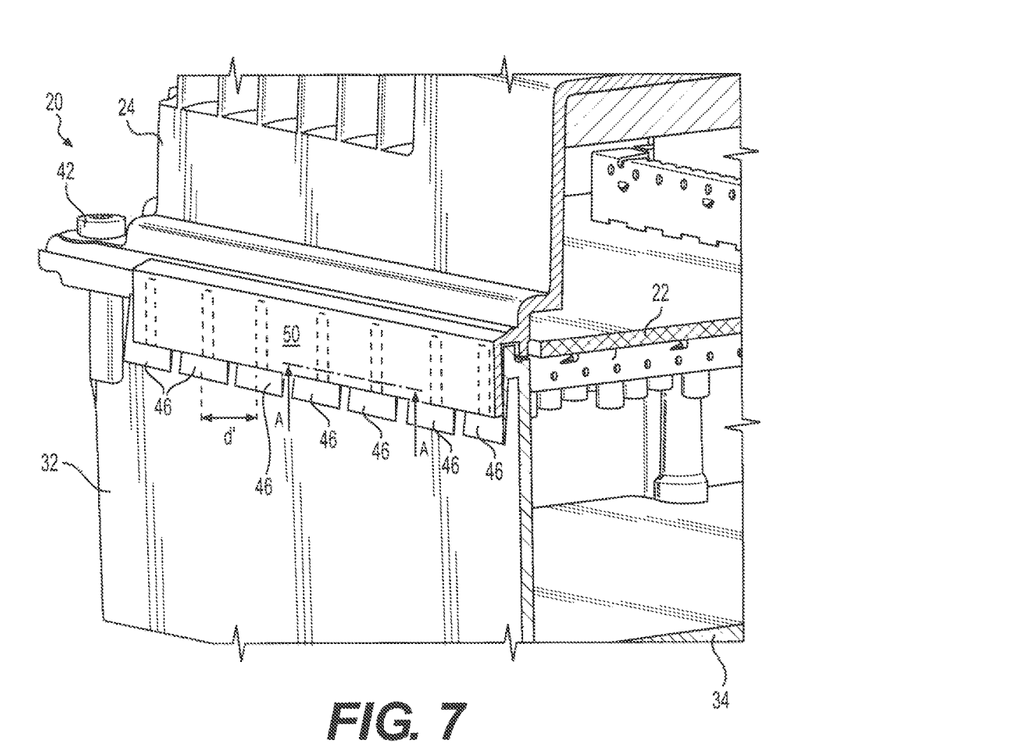
FIG. 7 is a perspective cut-away view of an enclosure according to an aspect of the present disclosure.
Figure 8:
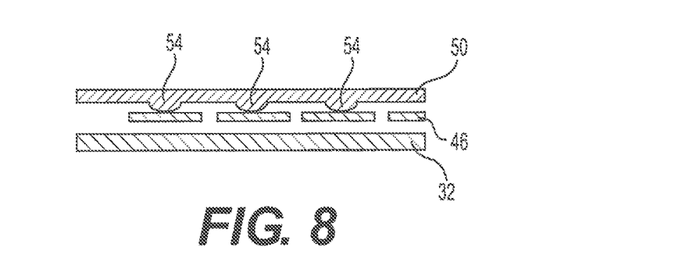
FIG. 8 is a cross-sectional view of the enclosure of FIG. 7 along the line A-A.

According to another aspect, and as shown in FIGS. 7-8, the enclosure 20 may include a curtain wall 50 about the open lower end 28 and extending beyond the lower rim 30 opposite the closed upper end 26 to a bottom edge 52. The curtain wall 50 may overlie some or all of two or more of the second teeth 46 with the housing portions 24, 32 being closed together. In this way, the curtain wall 50 may prevent the teeth 44, 46 from catching or pinching objects such as wires or a person's fingers as the enclosure 20 is closed. The curtain wall 50 may be integrally formed with the first housing portion 24. Furthermore, as shown in FIG. 8, the first teeth 44 may extend inwardly from the curtain wall 50 toward the enclosed space 40 to engage the corresponding ones of the second teeth 46. According to an aspect shown in FIG. 8, the first teeth 44 may be formed as ribs 54 extending perpendicularly to the lower rim 30.

Figure 9:
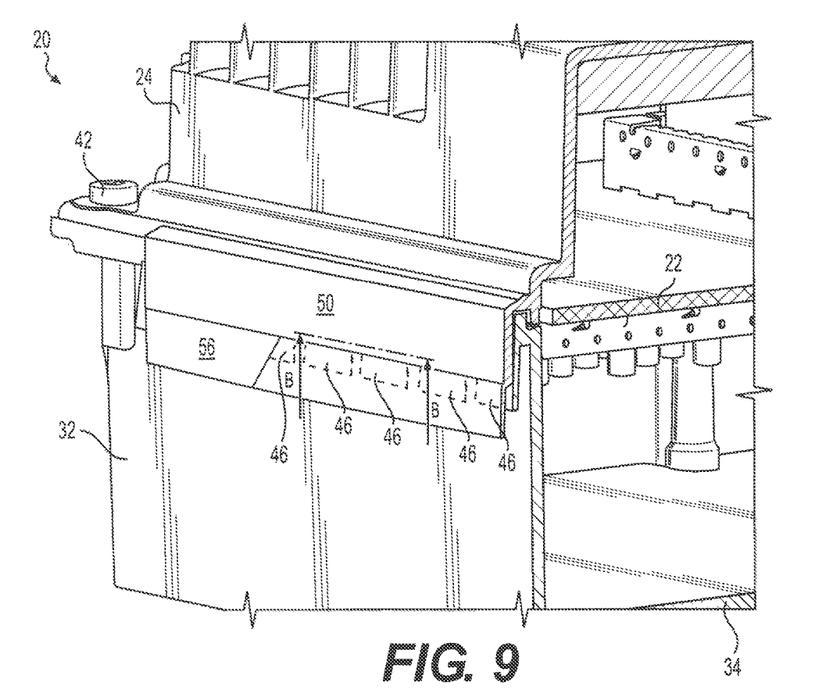
FIG. 9 is a perspective cut-away view of an enclosure according to an aspect of the present disclosure.
Figure 10:
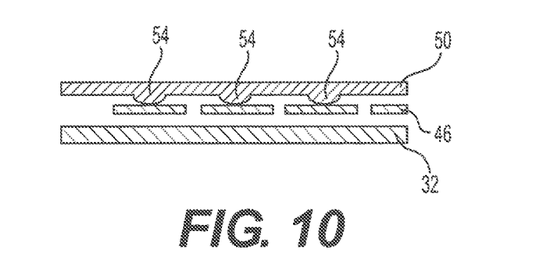
FIG. 10 is a cross-sectional view of the enclosure of FIG. 9 along the line B-B.

According to another aspect, and as shown in FIGS. 9-10, the enclosure 20 may further include a skirt 56 extending beyond the bottom edge 52 of the curtain wall 50 to a terminal edge 58. The skirt 56 may extend beyond the first teeth 44 with the housing portions 24, 32 being closed together to fully cover the first teeth 44. The skirt 56 may function to further prevent the teeth 44, 46 from catching or pinching objects such as wires or a person's fingers as the enclosure 20 is closed. The skirt 56 may also function to prevent the teeth 44, 46 from catching or pinching objects after the enclosure 20 is closed, such as, for example, when the enclosure 20 is installed in a machine or a vehicle. The skirt 56 may also be integrally formed with the first housing portion 24.

A method of forming an enclosure 20 for holding a printed circuit board 22 is also provided. The method may include steps for thixomolding metal comprising magnesium, which may include a combination of one or more of the following steps: providing chips comprising magnesium by a volumetric feeder into a heated barrel; providing an atmosphere of an inert gas such as, for example, argon in the heated barrel to prevent oxidation of the chips; heating the chips to a temperature between a solidus temperature and a liquidus temperature to create a semi-solid slurry; feeding the chips by a screw 12 feeder inside the barrel as the chips are heated; generating by the screw 12 feeder a shearing force in the semi-solid slurry to produce a globular structure; injecting the semi-solid slurry into a first mold cavity defining the shape of a first housing portion 24 extending between a closed upper end 26 and an open lower end 28 with a lower rim 30 extending thereabout to substantially fill the first mold cavity before the slurry solidifies; injecting the semi-solid slurry into a second mold cavity defining the shape of a second housing portion 32 extending between a closed lower end 34 and an open upper end 36 with an upper rim 38 extending thereabout to substantially fill the second mold cavity before the slurry solidifies; cooling the semi-solid slurry to cause the slurry to solidify into rough castings retaining the shape of the housing portions 24, 32 of the enclosure 20; and ejecting the rough castings from the mold cavities.

The method of forming an enclosure 20 for holding a printed circuit board 22 may proceed with the steps of: trimming the rough castings to remove excess material therefrom to produce the housing portions 24, 32. According to an aspect, the method may include integrally casting the first housing portion 24 with a plurality of first teeth 44 about the open lower end 28 and extending beyond the lower rim 30 opposite the closed upper end 26. According to a further aspect, the method may include integrally casting the second housing portion 32 with a plurality of second teeth 46 about the upper end and extending downwardly toward the closed lower end 34.

Obviously, many modifications and variations of the present invention are possible in light of the above teachings and may be practiced otherwise than as specifically described while within the scope of the appended claims.

What is claimed is:

1. An enclosure for holding a printed circuit board and comprising:
   a first housing portion of metal containing magnesium and extending between a closed end and an open end defining a rim thereabout;
   a second housing portion engaging said open end of said first housing portion to define an enclosed space within said housing portions for holding the printed circuit board;
   a plurality of first teeth integrally formed with said first housing portion about said open end and extending beyond said rim opposite said closed end;
   wherein said first teeth each engage said second housing portion in physical and electrical contact to block electromagnetic interference (EMI) with said housing portions closed together; and
   wherein said first teeth are elastically deformable to deflect from said second housing portion to provide a biasing force therebetween.

2. The enclosure of claim 1, wherein at least one of said first teeth tapers from a first thickness adjacent said open lower end to a second thickness less than said first thickness spaced apart from said open lower end; and
   wherein said at least one of said first teeth deflects outwardly away from said enclosed space as said first teeth engage said second teeth to provide a contact pressure therebetween.

3. The enclosure of claim 1, wherein said metal containing magnesium includes at least about 90% magnesium.

4. The enclosure of claim 1, wherein at least one of said housing portions is formed by a semi-solid metal casting process.

5. The enclosure of claim 4, wherein said semi-solid metal casting process is thixomolding.

6. An enclosure for holding a printed circuit board and comprising:
   a first housing portion extending between a closed upper end and an open lower end with a lower rim extending thereabout;
   a second housing portion extending between a closed lower end and an open upper end with an upper rim extending thereabout;
   said housing portions closing together with said open lower rim of said first housing portion engaging said upper rim of said second housing portion in a clamshell arrangement to define an enclosed space within said housing portions for holding the printed circuit board;
   a plurality of first teeth integrally formed with said first housing portion about said open lower end and extending beyond said lower rim opposite said closed upper end;
   a plurality of second teeth integrally formed with said second housing portion about said open upper end and extending downwardly toward said closed lower end;
   wherein at least one of said housing portions comprises metal containing magnesium;
   wherein said first teeth are aligned to overlap and engage corresponding ones of said second teeth in physical and electrical contact to block electromagnetic interference (EMI) with said housing portions closed together; and
   wherein at least one of said first teeth and said second teeth are elastically deformable to deflect from the corresponding ones of said teeth to provide a biasing force therebetween.

7. The enclosure of claim 6, wherein both of said housing portions comprise metal containing magnesium.

8. The enclosure of claim 6 wherein at least one of said housing portions is formed by a semi-solid metal casting process.

9. The enclosure of claim 8, wherein said semi-solid metal casting process is thixomolding.

10. The enclosure of claim 6, wherein at least one of said first teeth tapers from a first thickness adjacent said open lower end to a second thickness less than said first thickness spaced apart from said open lower end; and
   wherein said at least one of said first teeth deflects outwardly away from said enclosed space as said first teeth engage said second teeth to provide a contact pressure therebetween.

11. The enclosure of claim 6, wherein a corresponding one of said second teeth aligned with said at least one of said first teeth has a uniform thickness to provide structural rigidity in opposition to the contact pressure exerted by the contact with the corresponding one of said first teeth.

12. The enclosure of claim 6, wherein at least one of said second teeth tapers from a first thickness adjacent said open upper end to a second thickness less than said first thickness spaced apart from said open upper end; and
   wherein said at least one of said second teeth deflects inwardly toward said enclosed space as said first teeth engage said second teeth to provide a contact pressure therebetween.

13. The enclosure of claim 6 wherein a corresponding one of said first teeth aligned with said at least one of said second teeth has a uniform thickness to provide structural rigidity in opposition to the contact pressure exerted by the contact with the corresponding one of said second teeth.

14. The enclosure of claim 6, further including a curtain wall integrally formed with said first housing portion about said open lower end and extending beyond said lower rim opposite said closed upper end to a bottom edge; and
   wherein said curtain wall overlies two or more of said second teeth with said housing portions being closed together.

15. The enclosure of claim 14, wherein said first teeth extend inwardly from said curtain wall toward said enclosed space to engage said corresponding ones of said second teeth.

16. The enclosure of claim 14, wherein said first teeth are formed as ribs extending perpendicularly to said lower rim.

17. The enclosure of claim 14 further including a skirt integrally formed with said first housing portion and extending beyond said bottom edge of said curtain wall to a terminal edge; and
   wherein said skirt extends beyond said first teeth with said housing portions being closed together.

* * * * *